(12) United States Patent
Taketomi et al.

(10) Patent No.: US 11,302,860 B2
(45) Date of Patent: Apr. 12, 2022

(54) POWER GENERATION APPARATUS

(71) Applicant: Molex, LLC, Lisle, IL (US)

(72) Inventors: Kosuke Taketomi, Yamato (JP);
Kazusa Takashima, Yamato (JP)

(73) Assignee: Molex, LLC, Lisle, IL (US)

( * ) Notice: Subject to any disclaimer, the term of this patent is extended or adjusted under 35 U.S.C. 154(b) by 403 days.

(21) Appl. No.: 16/505,709

(22) Filed: Jul. 9, 2019

(65) Prior Publication Data

US 2020/0111945 A1 Apr. 9, 2020

(30) Foreign Application Priority Data

Oct. 4, 2018 (JP) .............................. JP2018-189091

(51) Int. Cl.
*H01L 41/04* (2006.01)
*H01L 41/047* (2006.01)

(52) U.S. Cl.
CPC ........ *H01L 41/0475* (2013.01); *H01L 41/042* (2013.01)

(58) Field of Classification Search
CPC . H01L 41/0475; H01L 41/042; H01L 41/113; H01L 41/1132; H01L 41/1134; H01L 41/1136; H01L 41/1138

USPC ........................................ 310/339, 365, 366
See application file for complete search history.

(56) References Cited

U.S. PATENT DOCUMENTS

2015/0247771 A1\* 9/2015 Puccio .................... G01L 1/162
73/723

FOREIGN PATENT DOCUMENTS

| JP | S62-44547 Y | 11/1987 |
| JP | 5396573 B2 | 1/2014 |
| JP | 2015021240 A | 2/2015 |
| JP | 2015228740 A | 12/2015 |
| WO | 2015/045231 A1 | 4/2015 |

\* cited by examiner

*Primary Examiner* — Derek J Rosenau

(57) ABSTRACT

A power generation apparatus includes a first power generation unit along with a second power generation unit. Each power generation unit has a piezoelectric element along with a base material holding the piezoelectric element. A first plus terminal is provided at a first edge of the base material, a second plus terminal is provided at a second edge of the base material, a first minus terminal is provided at a third edge of the base material, and a second minus terminal is provided at a fourth edge of the base material.

12 Claims, 12 Drawing Sheets

POWER GENERATION APPARATUS

RELATED APPLICATIONS

This Application Claims Priority to Japanese Application No, 2018-189091, filed on Oct. 4, 2018, which application is incorporated herein by reference in its entirety.

TECHNICAL FIELD

The present disclosure relates to a power generation apparatus configured by multiple power generation elements.

BACKGROUND ART

The below-mentioned Patent Documents 1 and 2 propose a mat shaped power generation apparatus which is configured by mutually coupled multiple piezoelectric elements and employed as a floor material. When a pedestrian steps on this power generation apparatus, the piezoelectric elements generate power.

PATENT DOCUMENT

Patent Document 1: JP 2015-228740 A
Patent Document 2: JP 2015-21240 A

SUMMARY

The shape and size of the power generation apparatus may be inappropriate for some shapes and ranges of the location in which a power generation apparatus is installed. The positions of the piezoelectric elements are fixed in each power generation apparatus of Patent Documents 1 and 2, making it difficult to change the shape and size of the power generation apparatus.

The power generation apparatus proposed in the present disclosure includes: a first power generation unit; and a second power generation unit coupled to the first power generation unit. Each of the first power generation unit and the second power generation unit includes:

a power generation element; a base material which holds the power generation element, and includes: a first edge in a first direction; a second edge which is the edge facing the first edge; a third edge formed in a second direction orthogonal to the first direction; and a fourth edge which is the edge facing the third edge; a first plus terminal serving as a positive electrode which is provided at the first edge and connected to the power generation element; a second plus terminal serving as a positive electrode which is provided at the second edge and connected to the power generation element; a first minus terminal serving as a negative electrode which is provided at the third edge and connected to the power generation element; and a second minus terminal serving as a negative electrode which is provided at the fourth edge and connected to the power generation element. This power generation apparatus enables an increased degree of freedom in the layout of the power generation unit. As a result, a high degree of freedom regarding the shape and size of the power generation apparatus can be assured.

DETAILED DESCRIPTION OF THE PREFERRED EMBODIMENTS

Figure 1:
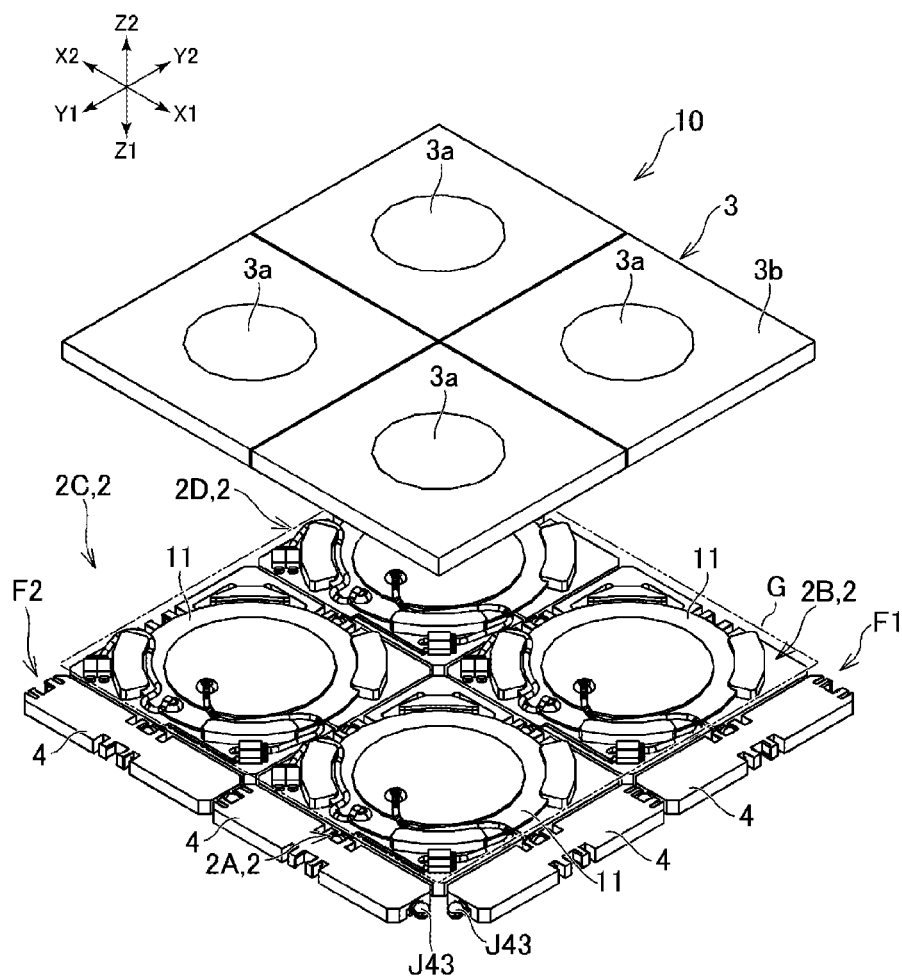
FIG. 1 is a perspective view illustrating one example of a power generation apparatus proposed in the present disclosure.

Hereinafter, the power generation apparatus proposed in the present disclosure will be described. In the present specification, a power generation apparatus 10 illustrated in FIG. 1, etc. will be described as one example of the power generation apparatus. In the following description, the directions indicated by X1 and X2 of FIG. 1 are respectively referred to as the right and the left, while the directions indicated by Y1 and Y2 of FIG. 1 are respectively referred to as forward and rearward. Moreover, the directions indicated by Z1 and Z2 of FIG. 1 are respectively referred to as above and below. While these directions are used to describe the relative positional relationships of members and sections configuring a connector, they do not limit the orientations thereof upon using the power generation apparatus 10.

As illustrated in FIG. 1, the power generation apparatus 10 has a power generation part G configured by multiple power generation units 2A, 2B, 2C, and 2D. Moreover, the power generation apparatus 10 may have coupling frame parts F1, F2 which are disposed outside the power generation part G to couple the power generation units 2A, 2B, 2C, and 2D.

The four power generation units 2A, 2B, 2C, and 2D are illustrated in FIG. 1. Hereinafter, if the four power generation units are distinguished from one another, "2A," "2B," "2C," and "2D" are used as the reference numerals of the power generation units, while in descriptions common to multiple power generation units, the reference numeral "2" is used as the reference numeral of all the power generation units. In the example of the power generation apparatus 10, the multiple power generation units 2 are aligned in two directions (the transverse and anteroposterior directions) orthogonal to each other. Two adjacent power generation units 2 are mutually coupled, such that the multiple power generation units 2 configure a mat shaped power generation apparatus 10. Note that the number of power generation units 2 illustrated in FIG. 1 is four, while more power generation units 2 (for example, several tens of power generation units 2) may be aligned in both the anteroposterior and transverse directions.

Figure 2:
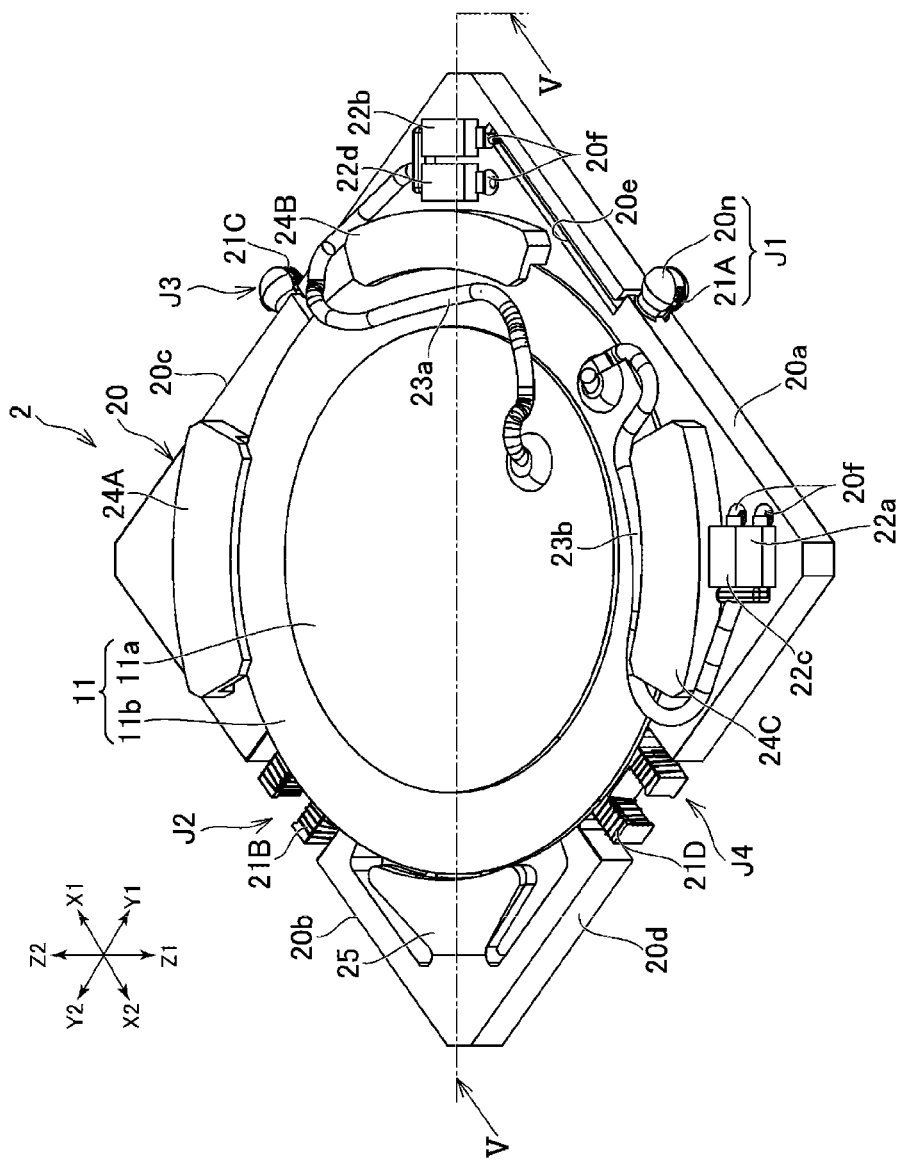
FIG. 2 is a perspective view illustrating a power generation unit configuring the power generation apparatus.

Each power generation unit 2 has a power generation element. As illustrated in FIG. 2, in the example of the power generation apparatus 10, the power generation unit 2 has a piezoelectric element 11 as the power generation element. The piezoelectric element 11 has a piezoelectric substance, generating electromotive force due to the pressure applied to the piezoelectric substance. The power generation apparatus 10 may be, for example, used as a floor material, along with a mat laid on the floor. When a pedestrian steps on the power generation apparatus 10, the piezoelectric element 11 receives pressure, generating electromotive force. In the example of the power generation apparatus 10, the number of piezoelectric elements 11 possessed by each power generation unit 2 is one. Unlike this, each power generation unit 2 may have multiple piezoelectric elements 11 (for example, two to four piezoelectric elements 11) which are electrically connected.

As illustrated in FIG. 2, the piezoelectric element 11 has, for example, a circular plate shape. Not limited to a circular shape, the shape of the piezoelectric element (power generation element) may be a square, pentagon, hexagon, etc. The piezoelectric element 11 may have an upper electrode 11*a* and a lower electrode 11*b*. The piezoelectric substance may be sandwiched between the two electrodes 11*a*, 11*b*. The electrodes 11*a*, 11*b* are connected to diodes 22*a* to 22*d* configuring the below-mentioned rectifier circuit 22 via conductor lines (electric wires) 23*a*, 23*b*.

Note that the power generation unit 2 may have a power generation element different from the piezoelectric element. For example, the power generation unit 2 may have, as the power generation element, a thermoelectric element which generates electromotive force due to the temperature difference.

As illustrated in FIG. 2, the power generation unit 2 may have a base material 20 for holding the piezoelectric element 11. The piezoelectric element 11, for example, is disposed on the upper side of the base material 20. The base material 20 is a member integrally formed with an insulating material (specifically, resin). The base material 20 may be configured by mutually combined multiple members.

As illustrated in FIG. 2, the base material 20 forms a substantial square, in addition to having a first edge 20*a*, a second edge 20*b* which is the edge facing the first edge 20*a*, a third edge 20*c* formed in the direction orthogonal to the first edge 20*a*, and a fourth edge 20*d* which is the edge facing the third edge 20*c*. In the example of the power generation apparatus 10, the power generation unit 2 is disposed such that the first edge 20*a* is disposed on the front side thereof, while the third edge 20*c* is disposed on the right side thereof. Unlike this, the power generation unit 2 may be disposed such that the first edge 20*a* is disposed on the right, left, and rear sides.

In the example of the power generation unit 2, the size D1 (see FIG. 3) of the base material 20 in the anteroposterior direction and the size D2 (see FIG. 3) thereof in the transverse direction are substantially the same. This facilitates turning of the direction of the power generation unit 2. For example, the power generation unit 2 can be rotated by 90° for use. Unlike the power generation unit 2, the size D1 in the anteroposterior direction may be different from the size D2 in the transverse direction. For example, in accordance with the shape of the piezoelectric element 11, the base material 20 may form an elongated rectangle in one direction.

The base material 20 may have multiple terminals 21A to 21D electrically connected to the piezoelectric element 11. As illustrated in FIG. 2, in the example of the power generation unit 2, the base material 20 has a terminal 21A disposed at the first edge 20*a*, a terminal 21B disposed at the second edge 20*b*, a terminal 21C disposed at the third edge 20*c*, and a terminal 21D disposed at the fourth edge 20*d*. The base material 20 respectively has connector parts J1 to J4 at the edges 20*a* to 20*d*. The terminals 21A to 21D are respectively provided in the connector parts J1 to J4. The structure of the connector parts J1 to J4 will hereinafter be described in detail. Note that unlike the power generation unit 2, the number of terminals may be greater than four.

Figure 3:
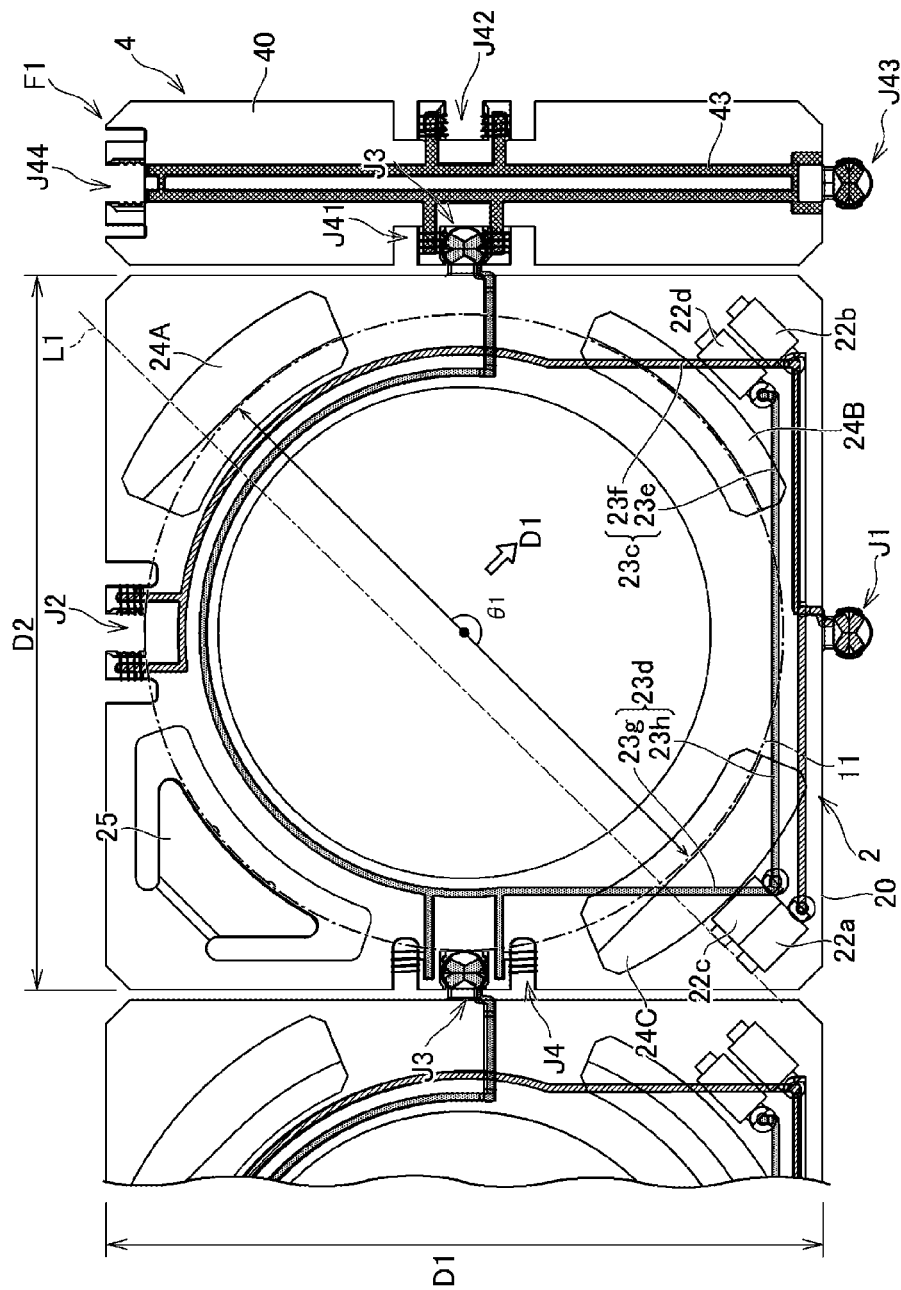
FIG. 3 is a plan view of a base material of the power generation unit along with a coupling unit. Conductor lines (electric wires) held by the base material are illustrated in half tone dot meshing.

The terminals 21A to 21D are connected to the piezoelectric element 11 via conductor lines 23*a* to 23*d* (see FIG. 4A) formed in the base material 20 (see FIGS. 2 and 3). In the example of the power generation unit 2, the terminals 21A to 21D are connected to the piezoelectric element 11 via the rectifier circuit 22 (see FIG. 4A).

Figure 4A:
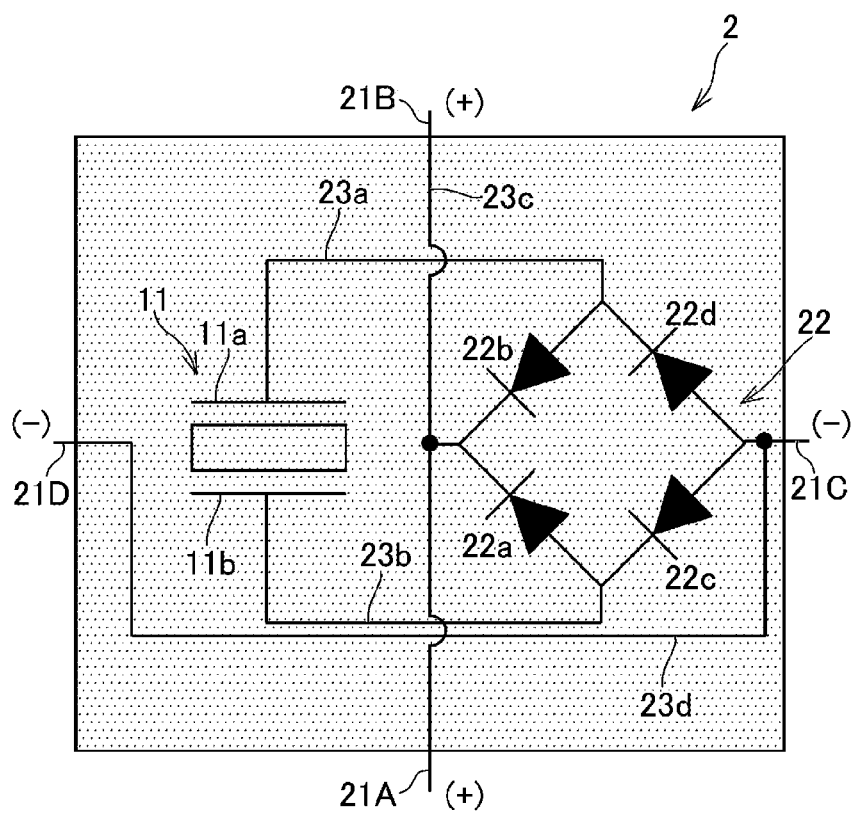
FIG. 4A is a view illustrating a circuit formed in the power generation unit.

Mutually facing pairs of terminals have the same polarity. That is, the terminals 21A and 21B are one of a positive electrode or a negative electrode, while the terminals 21C and 21D are the other of the positive electrode or the negative electrode. As illustrated in FIG. 4A, in the example of the power generation unit 2, the terminals 21A and 21B are positive electrodes, while the terminals 21C and 21D are negative electrodes. Hereinafter, the terminal 21A is referred to as a "first plus terminal," while the terminal 21B is referred to as a "second plus terminal." Moreover, the terminal 21C is referred to as a "first minus terminal," while the terminal 21D is referred to as a "second minus terminal."

Note that the first plus terminal 21A (first connector part J1) is disposed at the center of the first edge 20*a*. Similarly, the second plus terminal 21B (second connector part J2) is disposed at the center of the second edge 20*b*, the first minus terminal 21C (third connector part J3) is disposed at the center of the third edge 20*c*, and the second minus terminal 21D (fourth connector part J4) is disposed at the center of the fourth edge 20*d*.

In accordance with the structure of the power generation apparatus 10 configured by multiple power generation units 2, the size of the power generation apparatus 10 in the transverse direction can be adjusted in accordance with the number of power generation units 2 aligned in the transverse direction. Moreover, the size of the power generation apparatus 10 in the anteroposterior direction can be adjusted in accordance with the number of power generation units 2 aligned in the anteroposterior direction. Therefore, a high degree of freedom can be assured regarding the shape of the power generation apparatus 10. Moreover, the terminals 21A to 21D are respectively provided at all four edges 20*a* to 20*d* of the power generation unit 2. This facilitates changes in the layout of the power generation unit 2. The structure of such a power generation apparatus 10 is particularly effective when employing this as a floor material or a mat laid on the floor. Moreover, the terminals provided at mutually facing pairs of edges have the same polarity. This can simplify the structure for extracting power from the power generation apparatus 10. In the example of the power generation apparatus 10, multiple power generation units 2 are coupled such that positive electrodes are assembled on the front side of the power generation part G, while negative electrodes are assembled on the right side of the power generation part G. In addition, electric power can be extracted from the coupling frame part F2 disposed on the front side of the power generation part G along with the coupling frame part F1 disposed on the right side of the power generation part G.

Figure 4B:
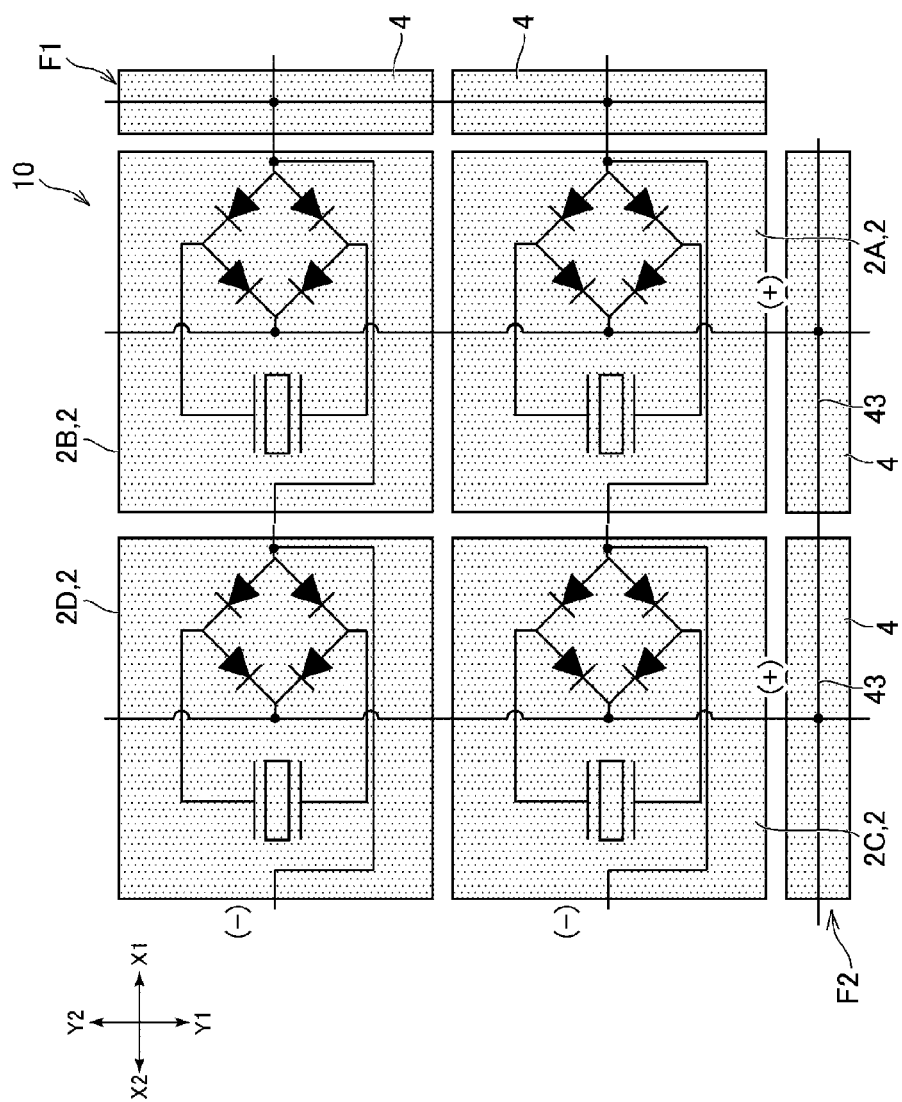
FIG. 4B is a view illustrating the connection of multiple power generation units.

As illustrated in FIGS. 4A and 4B, two power generation units 2 (for example, power generation units 2A, 2B) adjacent in the anteroposterior direction are electrically connected via the first plus terminal 21A of one power generation unit 2 (for example, the power generation unit 2B) along with the second plus terminal 21B of the other power generation unit 2 (for example, the power generation unit 2A). The two terminals 21A, 21B are in direct contact. Moreover, two power generation units 2 (for example, the power generation units 2A, 2C) adjacent in the transverse direction are electrically connected via the first minus terminal 21C of one power generation unit 2 (for example, the power generation unit 2A), along with the second minus terminal 21D of the other power generation unit 2 (for example, the power generation unit 2C). The two terminals 21C, 21D are in direct contact.

Therefore, in the example of the power generation apparatus 10, multiple power generation units 2 are connected in parallel. Moreover, the positive electrodes of the multiple power generation units 2 are assembled on the front and rear sides of the power generation part G, while the negative electrodes of the multiple power generation units 2 are assembled on the right and left sides of the power generation part G. Because the multiple power generation units 2 are thus connected in parallel, for example, even if the piezoelectric element 11 of one power generation unit 2 fails to function, another power generation unit 2 can be made to function, improving the durability of the power generation apparatus 10.

In accordance with pressure changes (vibrations) acting on the piezoelectric element 11, the polarities of the upper electrode 11a and the lower electrode 11b change. In other words, an alternating current is generated in the piezoelectric element 11. The power generation unit 2 may have the rectifier circuit 22 (see FIG. 4A) disposed between the terminals 21A to 21D and the electrodes 11a, 11b. The rectifier circuit 22 is a circuit for continuously setting the electric potential of plus terminals 21A, 21B such that they are higher than the electric potential of minus terminals 21C, 21D irrespective of the electromotive force of the piezoelectric element 11. The rectifier circuit 22 is, for example, a bridge rectifier circuit configured by four diodes 22a, 22b, 22c, and 22d, with the type of rectifier circuit not limited thereto.

In the example of the power generation apparatus 10, each power generation unit 2 has the rectifier circuit 22. That is, one rectifier circuit 22 is provided for one piezoelectric element 11. Therefore, electric power can be efficiently extracted from the piezoelectric element 11. Note that unlike the example of the power generation apparatus 10, each power generation unit 2 may have multiple piezoelectric elements 11 (for example, two to four piezoelectric elements 11). In this case, each power generation unit 2 may have multiple rectifier circuits 22 respectively corresponding to multiple piezoelectric elements 11. Moreover, in this case, the multiple piezoelectric elements 11 included in one power generation unit 2 may be connected in series or in parallel, via the rectifier circuit 22. As still another example, each power generation unit 2 may have multiple piezoelectric elements 11, as well as one rectifier circuit 22 for multiple piezoelectric elements 11.

As illustrated in FIGS. 2 and 4A, the power generation unit 2 has the conductor lines 23a, 23b, 23c, and 23d for connecting the piezoelectric element 11 and the terminals 21A to 21D. The conductor lines 23a, 23b, 23c, and 23d, for example, may be configured by electric wires (wires), a conductor film (metal film) formed on the surface of the base material 20, a conductor plate (metal plate) insert-molded in the base material 20, etc.

In the example of the power generation unit 2, the conductor line 23a (see FIGS. 2 and 4A) is a line for connecting the diodes 22b, 22d of the rectifier circuit 22 and the upper electrode 11a of the piezoelectric element 11. The conductor line 23b (see FIG. 2) connects the diodes 22a, 22c of the rectifier circuit 22 and the lower electrode 11b of the piezoelectric element 11. The conductor lines 23a, 23b are, for example, electric wires (wires) and are soldered to the piezoelectric element 11.

The conductor line 23c (see FIGS. 3 and 4A) is a line for mutually connecting the two plus terminals 21A, 21B, in addition to connecting the two plus terminals 21A, 21B to a power generation element 11 via the diodes 22a, 22b of the rectifier circuit 22. More specifically, the conductor line 23c includes a line 23e (see FIG. 3) extending from the first plus terminal 21A to the two diodes 22a, 22b, along with a line 23f (see FIG. 3) extending from this line 23e to the second plus terminal 21B. The conductor line 23d (see FIGS. 3 and 4A) is a line for mutually connecting the two minus terminals 21C, 21D, in addition to connecting the two minus terminals 21C, 21D to the power generation element 11 via the diodes 22c, 22d of the rectifier circuit 22. More specifically, the conductor line 23d includes a line 23g (see FIG. 3) extending from the first minus terminal 21C to the second minus terminal 21D, along with a line 23h (see FIG. 3) extending from this line 23g to two the diodes 22c, 22d. The conductor lines 23c, 23d are, for example, electric wires (wires).

In the example of the power generation unit 2, a groove 20e (see FIG. 2) is formed in the base material 20, such that the electric wires serving as the conductor lines 23c, 23d are housed in this groove 20e. The groove 20e may be formed on both the upper and lower surfaces of the base material 20. In addition, a through hole 20f (see FIG. 2) connecting the groove 20e on the upper surface thereof and the groove 20e on the lower surface thereof may be formed in the base material 20. The electric wires (wires) pass through this through hole 20f, wherein some electric wires may be housed in the groove 20e on the upper surface thereof, while other electric wires may be housed in the groove 20e on the lower surface thereof. The groove 20e is thus formed on both the upper and lower surfaces, enabling multiple electric wires to be crossed. The groove 20e is formed inside and outside the region with the piezoelectric element 11 disposed therein. The groove 20e may be only formed outside the region with the piezoelectric element 11 disposed therein. Note that in FIG. 3, the conductor lines 23c, 23d are illustrated in half tone dot meshing.

As mentioned above, the base material 20 has the first connector part J1 with the first plus terminal 21A provided therein, along with the second connector part J2 with the second plus terminal 21B provided therein. As illustrated in FIG. 2, in the example of the power generation apparatus 10, the first connector part J1 forms a projection, with the second connector part J2 forming a recess having a shape with the first connector part J1 capable of being fitted therein. The first plus terminal 21A is exposed on the surface of the first connector part J1, while the second plus terminal 21B is exposed on the surface of the second connector part J2. In the example of the power generation unit 2, electric wires (wires) making up the conductor line 23c are wound on the surface of the resin (a terminal holding part 20*i*, see FIG. 6A) making up the second connector part J2, with the wound part functioning as the second plus terminal 21B. Moreover, two through holes penetrating through this resin are formed in resin (a terminal holding part 20*n*) making up the first connector part J1, wherein the electric wires (wires) making up the conductor line 23*c* penetrate through the two through holes and are partially exposed on the side face of the resin making up the first connector part J1. The exposed part functions as the first plus terminal 21A.

The connector parts J1, J2 having the plus terminals 21A, 21B are thus formed so as to be fittable, simultaneously implementing the electric connection and mechanical connection of adjacent two power generation units 2. That is, when the first connector part J1 of one power generation unit 2 fits in the second connector part J2 of the other power generation unit 2, the two power generation units 2 can be electrically connected, simultaneously regulating the positional separation of the two.

The first connector part J1 and the second connector part J2 are, for example, ball joints. The first connector part J1 functions as the ball of the ball joint, while the second connector part J2 functions as the socket of the ball joint. When two power generation units 2 are coupled via the first connector part J1 and the second connector part J2, this structure enables one of the two power generation units 2 to be tilted towards the other. For example, one power generation unit 2A can be horizontally disposed, while the other power generation unit 2B can be tilted upward and downward. In this manner, when two adjacent power generation units 2 are tilted towards each other, the power generation apparatus 10 can be curved. As a result, for example, if the power generation apparatus 10 is employed as a mat laid on the floor, the shape of the power generation apparatus 10 can be aligned with any floor irregularities.

Figure 6A:
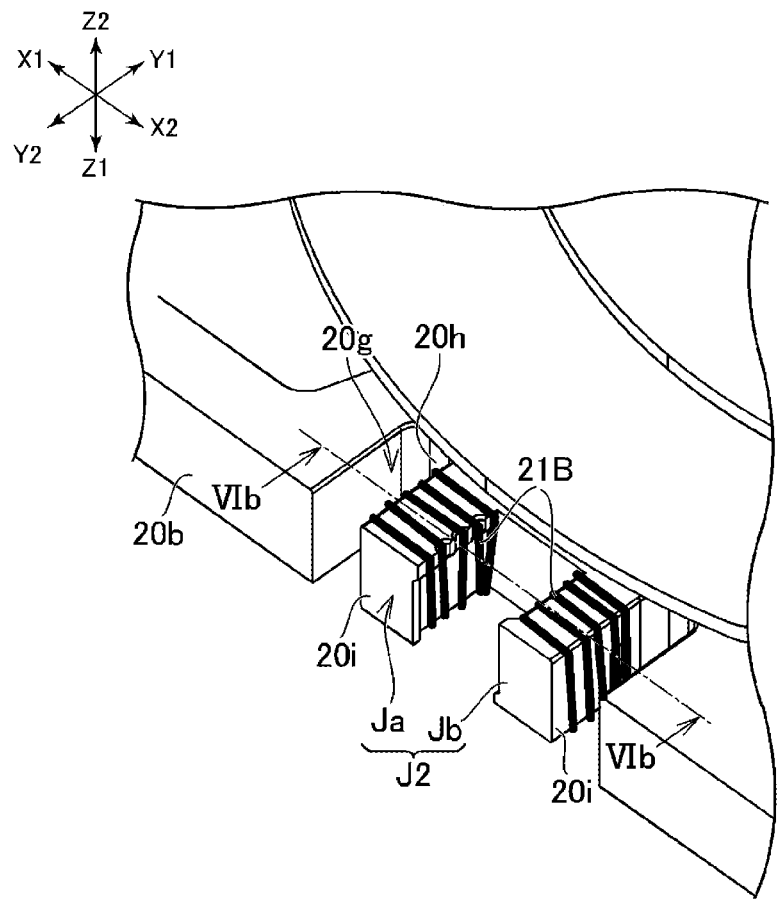
FIG. 6A is a perspective view illustrating the details of a connector part.

As illustrated in FIG. 6A, the second connector part J2 may have two connector half parts Ja, Jb mutually facing in the transverse direction. Each connector half part Ja, Jb has a terminal support part 20*i* formed of an insulating material (specifically, resin), along with the second plus terminal 21B exposed on the surface of the terminal support part 20*i*.

In the example of the power generation unit 2, a recess 20*g* is formed at the second edge 20*b* of the base material 20 (hereinafter, the recess 20*g* is referred to as a "connector housing recess"). Two terminal support parts 20*i* protruding rearward from a deep part 20*h* of the connector housing recess 20*g* are formed inside the connector housing recess 20*g*. That is, the second connector part J2 is formed inside the connector housing recess 20*g*. The terminal support part 20*i* is a part integrally formed with a resin part of the base material 20. The electric wires making up the conductor line 23*c* are wound around each terminal support part 20*i*. The wound electric wires serve as the second plus terminal 21B.

The second connector part J2 (the two connector half parts Ja, Jb) sandwiches the first connector part J1 in between. The two connector half parts Ja, Jb may be elastically deformable. That is, the two connector half parts Ja, Jb may be elastically deformable so as to enable mutual approach and separation. In addition, when the elastic deformation of the connector half parts Ja, Jb is employed, the coupling of two connector parts J1, J2 may be released. This facilitates a change in the shape of the power generation apparatus 10. Moreover, the contact pressure of the first connector part J1 and the second connector part J2 (the contact pressure of the two plus terminals 21A, 21B) can be assured, enabling improved stability of the electric connection of two power generation units 2.

As mentioned above, the second connector part J2 formed at the second edge 20*b* of the base material 20 is formed inside the connector housing recess 20*g*. This structure can prevent an unintended external force from acting on the second connector part J2. In other words, the second connector part J2 can be protected by the connector housing recess 20*g*. In the example of the power generation unit 2, the second connector part J2 (the connector half parts Ja, Jb) does not protrude rearward beyond the position of the second edge 20*b* of the base material 20. More specifically, the position of the rear end of the second connector part J2 in the anteroposterior direction is substantially the same as the position of the second edge 20*b* in the anteroposterior direction. This can effectively prevent unintended external force from acting on the second connector part J2.

The second connector part J2 has a recess between the two the connector half parts Ja, Jb. This recess is opened rearward and in the vertical direction. Therefore, the first connector part J1 of the power generation unit 2 and the second connector part J2 of the adjacent power generation unit 2 are attachable and detachable in the vertical direction. That is, the first connector part J1 can be removed upward from the second connector part J2, as well as downward from the second connector part J2. This can facilitate the attachment and detachment operation of the two power generation units 2.

Note that because the second connector part J2 is also opened rearward, the first connector part J1 and the second connector part J2 are attachable and detachable in the anteroposterior direction. Unlike this, the shapes of the first connector part J1 and the second connector part J2 may be shapes which allow only attachment and detachment in the vertical direction and regulate attachment and detachment in the anteroposterior direction. In still another example, the first connector part J1 may be configured so as to be removed only upward from the second connector part J2, as well as only downward from the second connector part J2.

Figure 6B:
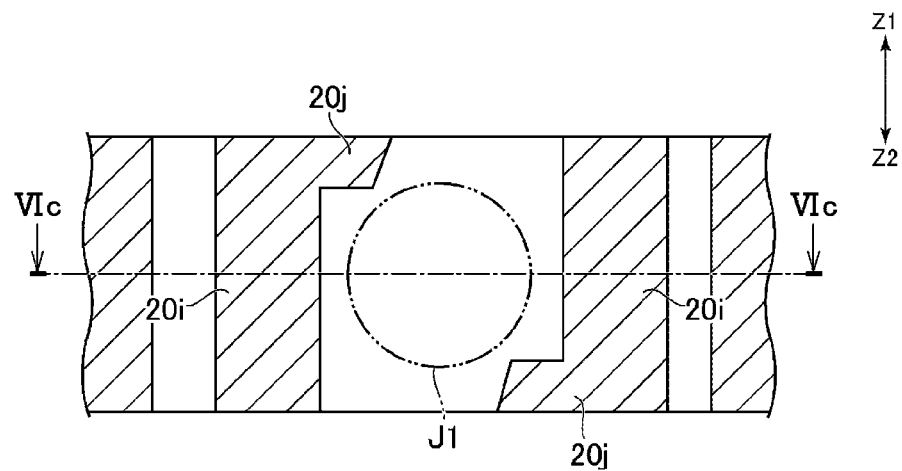
FIG. 6B is a cross sectional view along line VIb-VIb illustrated in FIG. 6A. In this view, electric wires (second plus terminals) illustrated in FIG. 6A are omitted.

The second connector part J2 may have a stopper 20*j* for limiting the vertical movement of the first connector part J1. As illustrated in FIG. 6B, the stopper 20*j*, for example, is a projection which protrudes inward from two terminal support parts 20*i* so as to come into contact with the second connector part J1.

In the example of the power generation unit 2, one terminal support part 20*i* has the stopper 20*j* at the upper edge thereof, but does not have the stopper 20*j* at the lower edge thereof. Moreover, the other terminal support part 20*i* has the stopper 20*j* at the lower edge thereof, but does not have the stopper 20*j* at the upper edge thereof. This structure can limit vertical movement of the first connector part J1 to the second connector part J2. Moreover, this structure can facilitate the formation of the second connector part J2 (more specifically, the formation of the terminal support parts 20*i*). That is, upon molding of the base material 20, the operation of removing a die from the two terminal support parts 20*i* can be facilitated.

Figure 6C:
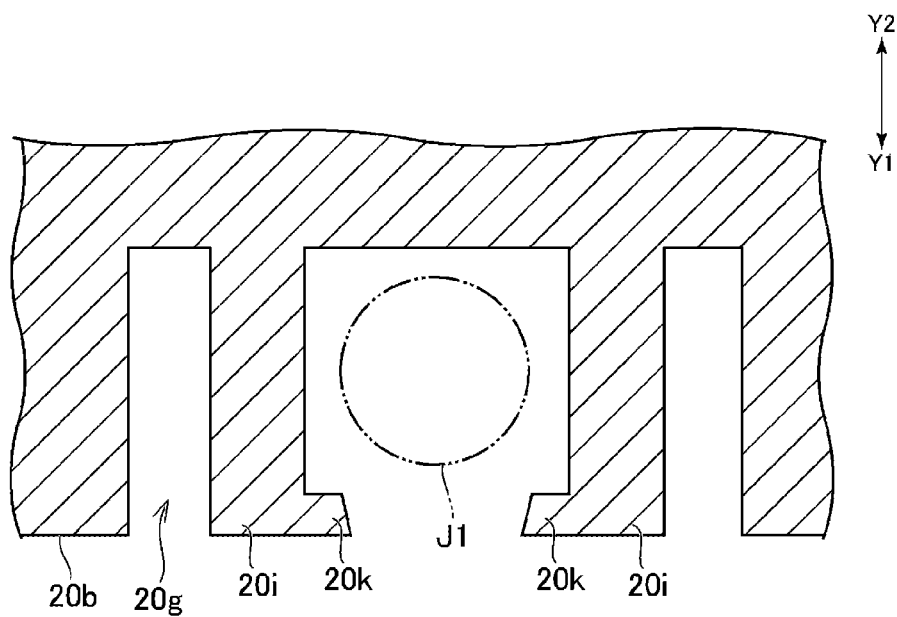
FIG. 6C is a cross sectional view along line VIc-VIc illustrated in FIG. 6B. In this view, electric wires (second plus terminals) illustrated in FIG. 6A are omitted.

As illustrated in FIG. 6C, the two terminal support parts 20*i* may have a stopper 20*k* for limiting the movement of the first plus terminal 21A in the anteroposterior direction. The stopper 20*k* is, for example, a projection protruding inward from the tips of the two terminal support parts 20*i*.

As illustrated in FIG. 2, the first connector part J1 protrudes forward from the first edge 20*a* of the base material 20. The end of the first connector part J1 forms a ball shape. In the example of the power generation unit 2, the base material 20 has a ball shaped terminal support part 20*n* protruding forward from the first edge 20*a*. This terminal support part 20*n* is a part integrally formed with the resin part of the base material 20. Two through holes penetrating through the terminal support part 20*n* are formed in each terminal support part 20*n*, while the electric wires making up the conductor line 23*c* penetrate through these through holes so as to be wound around the terminal support part 20*n*. The electric wire serving as the conductor line 23*c* is partially exposed on the side face of the terminal support part 20*n*. The exposed electric wires serve as the first plus terminal 21A. Unlike this, a conductor film may be formed on the surface of the terminal support part 20*n*, while this conductor film may function as the first plus terminal 21A.

Note that unlike the example of the power generation unit 2, a recess (the abovementioned connector housing recess 20*g*) may be formed at the first edge 20*a*, while the first connector part J1 may be formed inside this connector housing recess 20*g*. This can prevent unintended external force from acting on the first connector part J1. In other words, the first connector part J1 can be protected by the connector housing recess 20*g*.

As illustrated in FIG. 2, the base material 20 has the third connector part J3 with the first minus terminal 21C (see FIG. 4A) provided therein, along with the fourth connector part J4 with the second minus terminal 21D (see FIG. 4A) provided therein. As in the connector parts J1, J2, the third connector part J3 forms a projection, while the fourth connector part J4 forms a recess having a shape with the third connector part J3 capable of being fitted therein. In the example of the power generation unit 2, the third connector part J3 and the fourth connector part J4 configure the ball joint as in the connector parts J1, J2. The third connector part J3 functions as the ball of the ball joint, while the fourth connector part J4 functions as the socket of the ball joint.

In the example of the power generation unit 2, the first connector part J1 and the third connector part J3 have the same shape and structure. Moreover, when the power generation unit 2 is rotated by 90°, the first connector part J1 reaches the position of the third connector part J3. Similarly, the second connector part J2 and the fourth connector part J4 have the same shape and structure. Moreover, when the power generation unit 2 is rotated by 90°, the second connector part J2 reaches the position of the fourth connector part J4.

In the example of the power generation apparatus 10, the coupling of two power generation units 2 adjacent in the anteroposterior direction is only formed by the first connector part J1 of one power generation unit 2 along with the second connector part J2 of the other power generation unit 2. That is, two power generation units 2 adjacent in the anteroposterior direction do not have a structure for mechanically coupling these two power generation units 2, in addition to the connector parts J1, J2. As a result, for example, compared with the structure in which the two power generation units 2 are mechanically coupled at multiple positions, relative displacement (for example, tilt) of the two power generation units 2 tends to be generated, with the degree of freedom more easily obtained regarding the shape of the power generation apparatus 10. Moreover, the coupling of two power generation units 2 adjacent in the transverse direction is only formed by the third connector part J3 of one power generation unit 2 along with the fourth connector part J4 of the other power generation unit 2. That is, two power generation units 2 adjacent in the transverse direction do not have a structure for mechanically coupling these two power generation units 2, in addition to the connector parts J3, J4. As a result, for example, compared with the structure in which the two power generation units 2 are mechanically coupled at multiple positions, relative displacement (for example, tilt) of the two power generation units 2 tends to be generated, with the degree of freedom more easily obtained regarding the shape of the power generation apparatus 10.

The coupling structure of the power generation unit 2 is not limited to the example of the power generation apparatus 10. For example, the power generation unit 2 may have a structure to be coupled to an adjacent power generation unit 2 in addition to the connector parts J1, J2, at the first edge 20*a* and the second edge 20*b*. In this case, the connector parts J1, J2 may not configure the ball joint. Similarly, the power generation unit 2 may have a structure to be coupled to an adjacent power generation unit 2 in addition to the connector parts J3, J4, at the third edge 20*c* and the fourth edge 20*d*. In this case, the connector parts J3, J4 may not be configure the ball joint.

Figure 5:
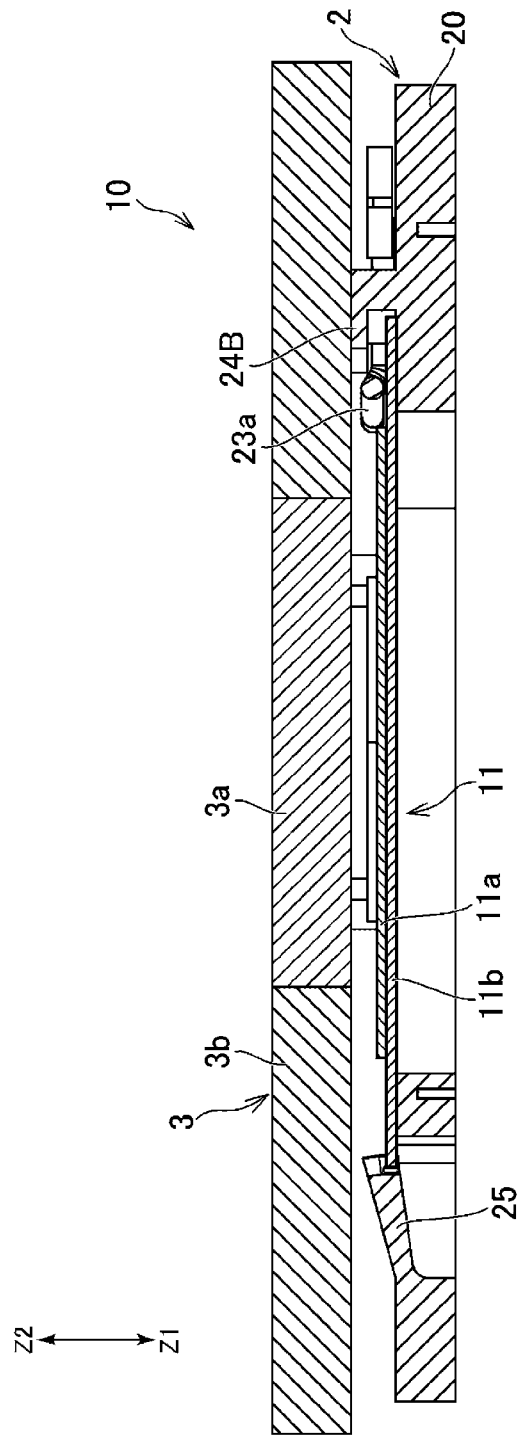
FIG. 5 is a cross sectional view of the power generation apparatus and a buffer material obtained in the cut surface illustrated by line V-V of FIG. 2.

The piezoelectric element 11, for example, is installed on the upper side of the base material 20. As illustrated in FIG. 5, the base material 20 supports the outer peripheral part of the piezoelectric element 11. The central part of the piezoelectric element 11 is exposed downward. That is, the base material 20 does not support the central part of the piezoelectric element 11. This structure tends to deform a piezoelectric substance, easily generating the electromotive force of the piezoelectric substance.

In the example of the power generation unit 2, the base material 20 has, on the lower side of the piezoelectric element 11, an opening of a size corresponding to the upper electrode 11*a* of the piezoelectric element 11 as well as to the piezoelectric substance. The lower electrode 11*b* has a larger size than the upper electrode 11*a* and the piezoelectric substance, in addition to having an outer peripheral part which is the region outside the outer edge of the upper electrode 11*a*. The base material 20 supports the outer peripheral part of the lower electrode 11*b*.

As illustrated in FIGS. 1 and 5, the power generation apparatus 10 may have a buffer material 3 covering the upper side of multiple power generation units 2. If the power generation apparatus 10 is used as a floor material or a mat laid on the floor, the buffer material 3 protects the piezoelectric element 11, the diodes 22*a* to 22*d*, the conductor lines 23*a* to 23*d*, etc. The buffer material 3, for example, may be formed of a sheet shaped sponge and a sheet shaped rubber.

In the buffer material 3, only a part 3*a* disposed above the piezoelectric substance possessed by the piezoelectric element 11 may have higher rigidity than other parts 3*b*. Here, the part 3*a* is referred to as a "pressing part." As a result, the force from a pedestrian tends to be transmitted to the piezoelectric substance, with great electromotive force easily obtained. The pressing part 3*a* of the buffer material 3 may be formed of a material which is different from the peripheral parts 3*b* thereof and harder than that of the parts 3*b*, or may be a part obtained by compressing and solidifying the material (for example, a sponge) of the buffer material 3. Unlike the example of the power generation unit 2, the pressing part 3*a* may have a projection protruding towards the piezoelectric element 11.

As illustrated in FIG. 2, the base material 20 has engagement parts 24A, 24B, 24C, and 25 which engage with the edge of the piezoelectric element 11 and define the position of the piezoelectric element 11 in the base material 20. In the example of the power generation unit 2, the engagement parts 24A, 24B, 24C, and 25 are formed along the outer peripheral edge of the piezoelectric element 11.

The engagement parts 24A, 24B, and 24C cover the upper side of the outer peripheral edge of the piezoelectric element 11, regulating the separation of the piezoelectric element 11 from the base material 20. In the example of the power generation unit 2, the base material 20 has multiple (specifically, three) engagement parts 24A, 24B, and 24C. The number of the engagement parts 24A, 24B, and 24C may be different from the example of the power generation unit 2. For example, the number of engagement parts may be one or greater than three. Moreover, the engagement parts may have a shape in which all three engagement parts 24A to 24C are connected.

As described below, the engagement part 25 and the engagement parts 24A to 24C may be formed so as to allow attachment and detachment of the piezoelectric element 11 to and from the base material 20. This can facilitate the installation operation of the piezoelectric element 11 to the base material 20.

In the example of the power generation unit 2, the engagement parts 24A to 24C are disposed so as to allow movement of the piezoelectric element 11 in the direction (the horizontal direction) along the base material 20. More specifically, the first engagement part 24A and the third engagement part 24C are disposed so as to face each other across the center of the piezoelectric element 11, while the second engagement part 24B is disposed on one side with respect to the first engagement part 24A and the third engagement part 24C. That is, the second engagement part 24B is disposed in the direction (the D1 direction indicated in FIG. 3) orthogonal to the straight line L1 (see FIG. 3) passing through the first engagement part 24A and the third engagement part 24C. Therefore, the three engagement parts 24A to 24C only surround a range of 180° or less at the outer peripheral edge of the piezoelectric element 11 (the range of θ1 in FIG. 3). Therefore, the engagement parts 24A to 24C allow movement of the piezoelectric element 11 in a direction away from the engagement parts 24A to 24C, specifically, in the direction opposite D1 indicated by FIG. 3.

As illustrated in FIGS. 2 and 5, the engagement part 25 is disposed so as to face the second engagement part 24B and functions as a stopper which regulates the movement of the piezoelectric element 11 in the direction away from the engagement parts 24A to 24C. Unlike the engagement parts 24A to 24C, the engagement part 25 is elastically deformable so as to allow attachment and detachment of the piezoelectric element 11 to and from the power generation unit 2. In the example of the power generation unit 2, the engagement part 25 is elastically deformable in the vertical direction. The downward displacement of the engagement part 25 allows movement of the piezoelectric element 11 in the direction along the base material 20 from the regular position (the position of the piezoelectric element 11 illustrated in FIG. 5) fitted in the engagement parts 24A to 24C. When the piezoelectric element 11 is installed in the base material 20, the engagement part 25 is displaced downward, the piezoelectric element 11 is slid in the direction along the base material 20, while the outer peripheral edge of the piezoelectric element 11 is fit in the lower side of the engagement parts 24A, 24B, and 24C.

As illustrated in FIGS. 1 and 3, the power generation apparatus 10 includes coupling frame parts F1, F2. In the example of the power generation apparatus 10, each of the coupling frame parts F1, F2 is configured by multiple coupling units 4. The coupling frame part F1 is provided on the right side of the power generation part G, while the coupling frame part F2 is provided on the front side of the power generation part G. In the example of the power generation apparatus 10, no coupling frame part is provided on the left and rear sides of the power generation part G. The disposition of the coupling frame part is not limited to the example of the power generation apparatus 10. The coupling frame part, for example, may be provided on the right, front, left, and rear sides of the power generation part G.

Attention is now directed towards power generation units 2 (power generation units 2A, 2B in FIG. 1) which are disposed on the rightmost side in the power generation part G and aligned in the anteroposterior direction. As illustrated in FIGS. 1 and 3, the coupling frame part F1 (coupling unit 4) disposed on the right side of the power generation part G is coupled to the third connector part J3 of the power generation unit 2A and the third connector part J3 of the power generation unit 2B. The first minus terminal 21C (see FIG. 2) of the third connector part J3 of adjacent two power generation units 2A, 2B is electrically connected via the coupling frame part F1. The coupling frame part F1 is connected to the first minus terminal 21C of another power generation unit 2 disposed behind the power generation units 2A, 2B. Therefore, the negative electrodes of all power generation units 2 disposed in the power generation part G are connected in parallel via the coupling frame part F1.

Here, the group configured by multiple power generation units 2 (for example, the power generation units 2A, 2C) aligned in the transverse direction is referred to as a "unit line." In the power generation part G, multiple unit lines are aligned in the anteroposterior direction. In the coupling frame part F1, multiple coupling units 4 are aligned in the anteroposterior direction. In the example of the power generation apparatus 10, one coupling unit 4 is provided in one unit line. This structure of the coupling frame part F1 can change the length of the coupling frame part F1, eliminating the constraint (caused by the coupling frame part F1) regarding the size of the power generation part G in the anteroposterior direction. The length of the coupling unit 4 (the length in the anteroposterior direction) corresponds to the size D1 (see FIG. 3) of each power generation unit 2 in the anteroposterior direction.

Subsequently, attention is directed towards power generation units 2 (the power generation units 2A, 2C in FIG. 1) which are disposed on the foremost part of the power generation part G and aligned in the transverse direction. The coupling frame part F2 disposed on the front side of the power generation part G is coupled to the first connector part J1 of the power generation unit 2A and the first connector part J1 of the power generation unit 2C. The first plus terminals 21A of the first connector parts J1 of the adjacent two power generation units 2A, 2C are electrically connected via the coupling frame part F2. The coupling frame part F2 is connected to the first plus terminal 21A of another power generation unit 2 disposed on the left of the power generation units 2A, 2C. Therefore, the positive electrodes of all power generation units 2 disposed in the power generation part G are connected in parallel via the coupling frame part F1.

The group configured by multiple power generation units 2 (for example, the power generation units 2A, 2B) aligned in the anteroposterior direction is referred to as a "unit row." In the power generation part G, multiple unit rows are aligned in the transverse direction. In the coupling frame part F2, multiple coupling units 4 are aligned in the transverse direction. In the example of the power generation apparatus 10, one coupling unit 4 is provided in one unit row. This structure of the coupling frame part F2 can change the length of the coupling frame part F2, eliminating the constraint (caused by the coupling frame part F2) regarding the size of the power generation part G in the transverse direction. The length (the length in the transverse direction) of the coupling unit 4 configuring the coupling frame part F2 corresponds to the size D2 of each power generation unit 2 in the transverse direction.

In this manner, in the power generation apparatus 10, the coupling frame parts F1, F2 (in other words, the coupling unit 4) are connected to the connector parts J1, J3 of the power generation unit 2. This can prevent unintended external force from acting on the connector parts J1, J3. In other words, the connector parts J1, J3 can be protected with the coupling frame parts F1, F2. Note that in the example of the power generation apparatus 10, no coupling frame part is provided on the left and rear sides of the power generation part G. However, because the fourth connector part J4 and the second connector part J2 of the power generation unit 2 are disposed inside the connector housing recess 20g of the base material 20 (see FIG. 6A), if no coupling frame part is provided on the left and rear sides of the power generation part G, unintended external force can be prevented from acting on the connector parts J4, J2.

As illustrated in FIG. 3, the coupling unit 4 configuring the coupling frame part F1 includes: a first connector part J41 connected to the third connector part J3 of the power generation unit 2; and a second connector part J42 disposed so as to face the first connector part J41. Moreover, the coupling unit 4 includes a third connector part J43 and a fourth connector part J44 for connecting the adjacent coupling unit 4. Terminals are formed at four connector parts J41 to J44. The terminals of all connector parts J41 to J44 are electrically connected via a conductor line 43.

The coupling unit 4 has a base material 40. The base material 40 is a member integrally formed with an insulating material (specifically, resin). The base material 40 may be configured by mutually combined multiple members. The conductor line 43 is, for example, an electric wire (wire). A groove is formed in the base material 40, such that the electric wire serving as the conductor line 43 is housed in this groove. Note that the conductor line 43 may be a conductor film (metal film) formed on the surface of the base material 40 made of resin. In still another example, the conductor line 43 may be a conductor plate (metal plate). In this case, the conductor plate serving as the conductor line 43 may be embedded in resin serving as the material of the base material 40. That is, the conductor plate and the base material 40 are insert molded.

The coupling unit 4 configuring the coupling frame part F2 has the same structure as the coupling unit 4 configuring the coupling frame part F1. The coupling unit 4 configuring the coupling frame part F2 is disposed at an orientation obtained by rotating the coupling unit 4 configuring the coupling frame part F1 by 90°. Therefore, the coupling unit 4 configuring the coupling frame part F2 is connected to the first connector part J1 of the power generation unit 2 at the second connector part J42.

The coupling unit 4 configuring the coupling frame part F2 may not necessarily have the same structure as the coupling unit 4 configuring the coupling frame part F1. For example, the coupling unit 4 configuring the coupling frame part F1 may not have the second connector part J42. In contrast, the coupling unit 4 configuring the coupling frame part F2 may not have the first connector part J41. In still another example, if the size D1 of the power generation unit 2 in the anteroposterior direction is different from the size D2 thereof in the transverse direction, each of the coupling unit 4 configuring the coupling frame part F1 and the coupling unit 4 configuring the coupling frame part F2 may have lengths respectively aligned with the sizes D1, D2.

The third connector part J3 of the power generation unit 2 and the first connector part J41 of the coupling unit 4 configure, for example, the ball joint. The third connector part J3 functions as the ball of the ball joint, while the first connector part J41 functions as the socket of the ball joint. In accordance with this structure, the coupling unit 4 can be tilted towards the power generation unit 2. As a result, for example, if the power generation apparatus 10 is employed as a mat disposed on the floor based on these tilts, the shape of the power generation apparatus 10 can be aligned with floor irregularities.

In the coupling unit 4, the second connector part J42 has the same structure as the first connector part J41. That is, the first connector part J1 of the power generation unit 2 and the second connector part J42 of the coupling unit 4 configure, for example, the ball joint. The first connector part J1 functions as the ball of the ball joint, while the second connector part J42 functions as the socket of the ball joint.

The connector parts J41, J42 of the coupling unit 4 may have the same structure as the connector parts J2, J4 of the power generation unit 2. That is, a connector housing recess may be formed at the edge of the base material 40, while two terminal support parts may be formed inside the connector housing recess. In addition, the electric wires making up the conductor line 43 may be wound around the terminal support parts so as to configure the terminals. This structure can prevent unintended external force from acting on the connector parts J41, J42. Unlike the example of the coupling unit 4, a conductor film may be formed on the surface of the terminal support part.

The third connector part J43 and the fourth connector part J44 may also configure the ball joint. The third connector part J43 functions as the ball of the ball joint, while the fourth connector part J44 functions as the socket of the ball joint. When two coupling units 4 are coupled via the third connector part J43 and the fourth connector part J44, this structure enables one of the two coupling units 4 to be tilted towards the other. By tilting the two adjacent coupling units 4 towards each other, the power generation apparatus 10 can be curved. As a result, for example, if the power generation apparatus 10 is employed as a mat disposed on the floor, the shape of the power generation apparatus 10 can be aligned with recesses and projections of the floor. The connector parts J43, J44 of the coupling unit 4 may respectively have the same structure as the connector parts J1, J2 of the power generation unit 2.

The structure of the coupling frame parts F1, F2 is not limited to the example of the power generation apparatus 10. For example, one coupling unit 4 may be provided in multiple unit rows (for example, two or three unit rows). Similarly, one coupling unit 4 may be provided in multiple unit lines (for example, two or three unit lines). In still another example, all of multiple coupling units 4 aligned in the anteroposterior direction in the coupling frame part F1 may be integrally formed. In still another example, all of multiple coupling units 4 aligned in the transverse direction in the coupling frame part F2 may be integrally formed.

The power generation apparatus 10 may have a component (not illustrated) for consuming and accumulating electric power obtained in the power generation part G. Exemplary such components include a light emitting element (for example, a Light Emitting Diode (LED)), a capacitor, etc. Here, such a component is referred to as a "functional component."

The functional component is, for example, disposed between the coupling unit 4 (the coupling unit 4 of the coupling frame part F1) connected to the negative electrode of the power generation unit 2 and the coupling unit 4 (the coupling unit 4 of the coupling frame part F2) connected to the positive electrode of the power generation unit 2. Two coupling units 4 are connected to the power generation unit 2A disposed at the corner of the power generation part G. Therefore, the functional component, for example, is connected to terminals of the two coupling units 4 (terminals of the third connector part J43).

In another example, the functional component may be disposed in the region of the power generation part G. That is, instead of some power generation units 2 in the power generation part G, the functional component may be disposed. In this case, one terminal of the functional component is connected to the plus terminals 21A, 21B of adjacent power generation units 2, while the other terminal of the functional component is connected to the minus terminals 21C, 21D of the adjacent power generation units 2.

Figure 7:
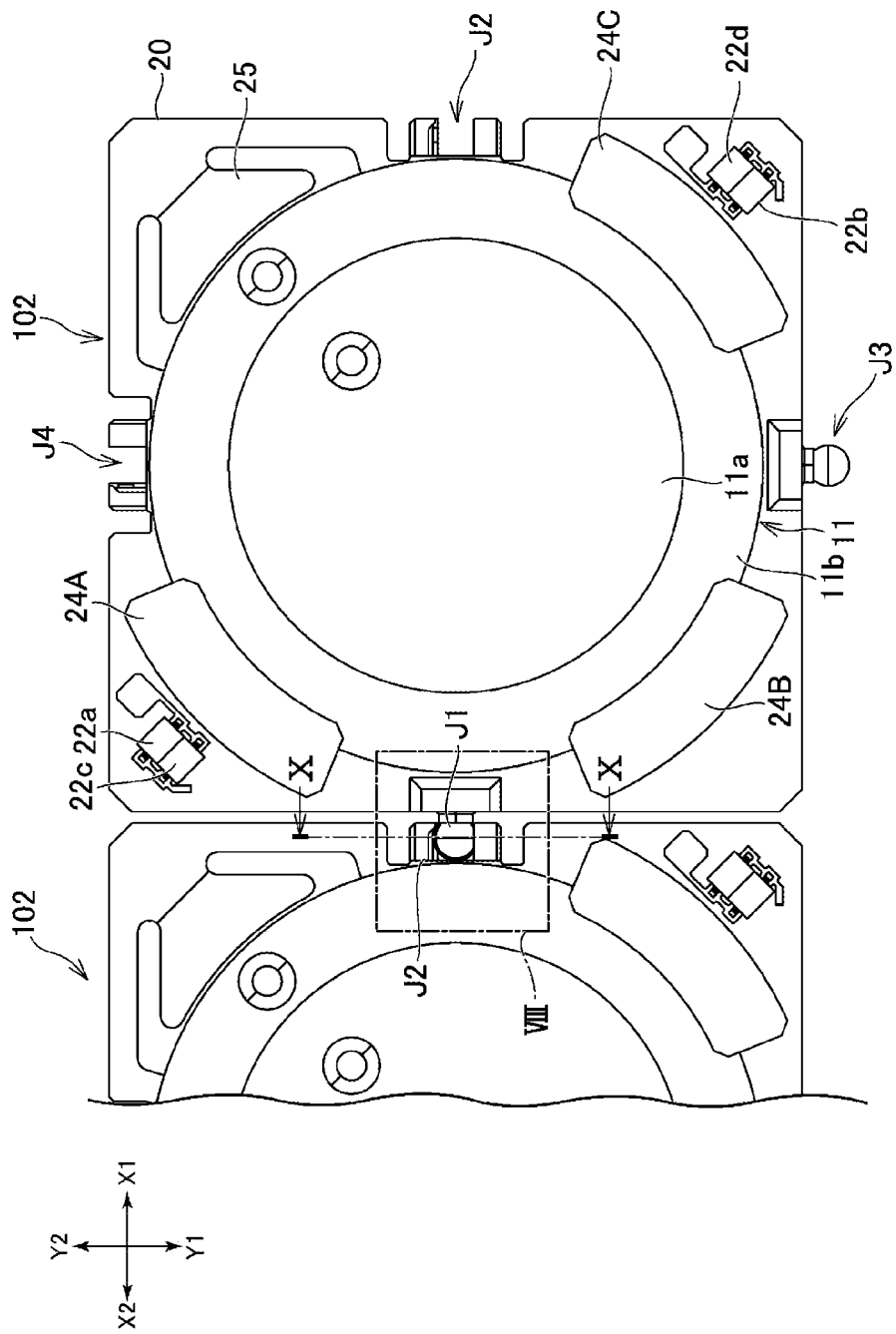
FIG. 7 is a plan view illustrating a modified example of the power generation unit.
Figure 8:
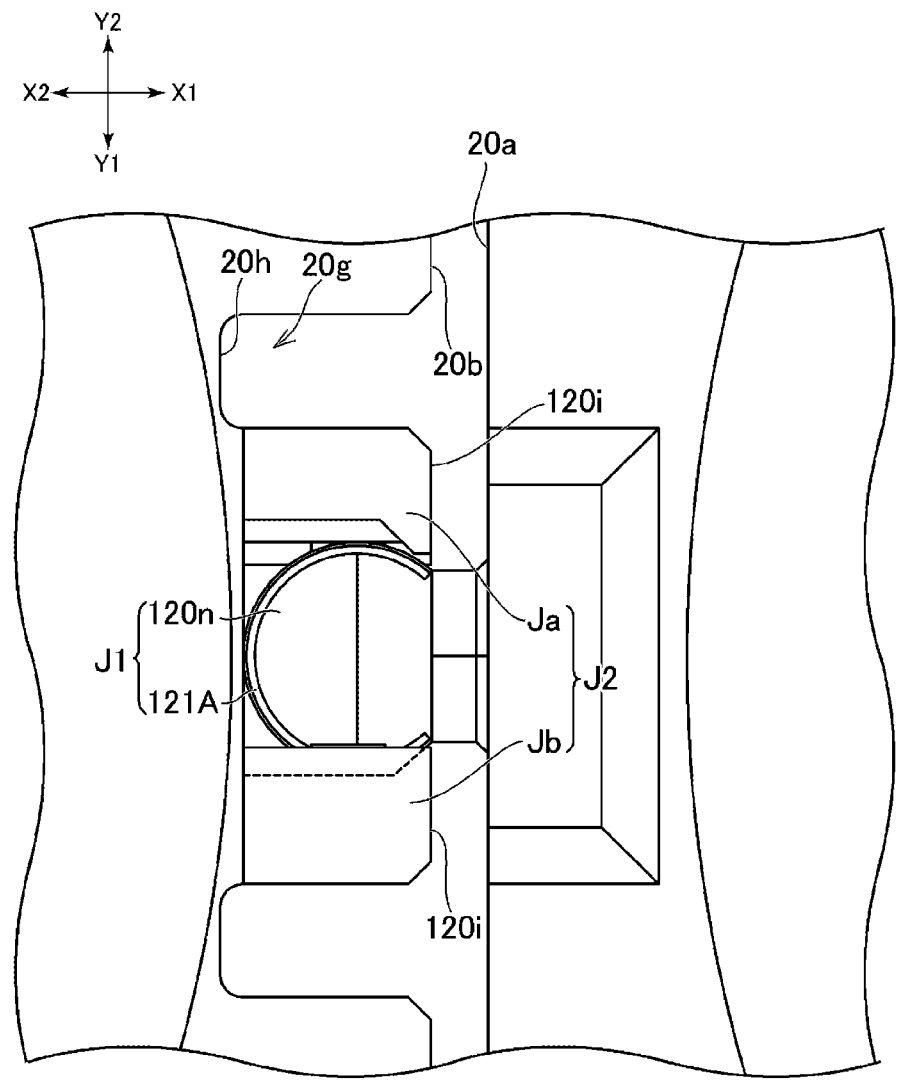
FIG. 8 is an enlarged view of the region VIII illustrated in FIG. 7, wherein the coupling structure of the power generation unit is illustrated.
Figure 9:
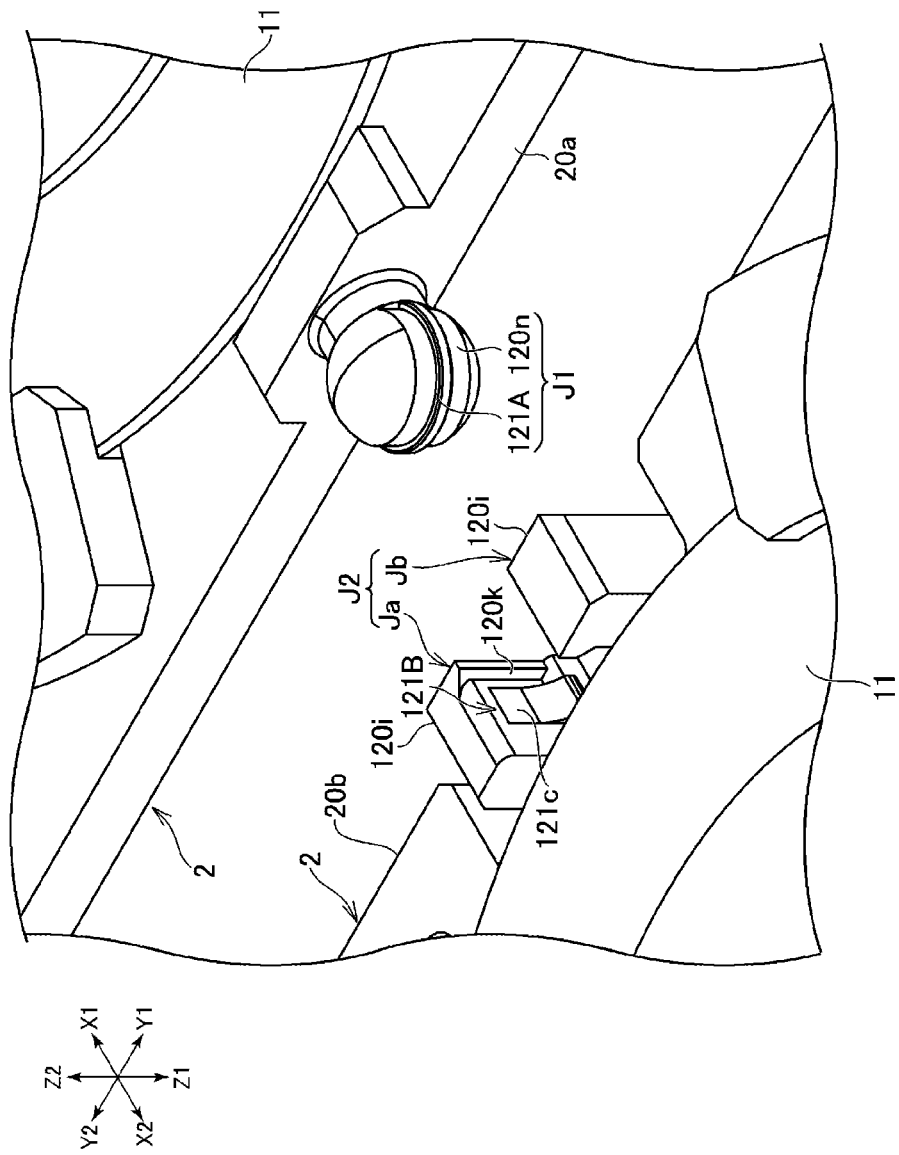
FIG. 9 is an exploded perspective view of the coupling structure illustrated in FIG. 8.
Figure 10:
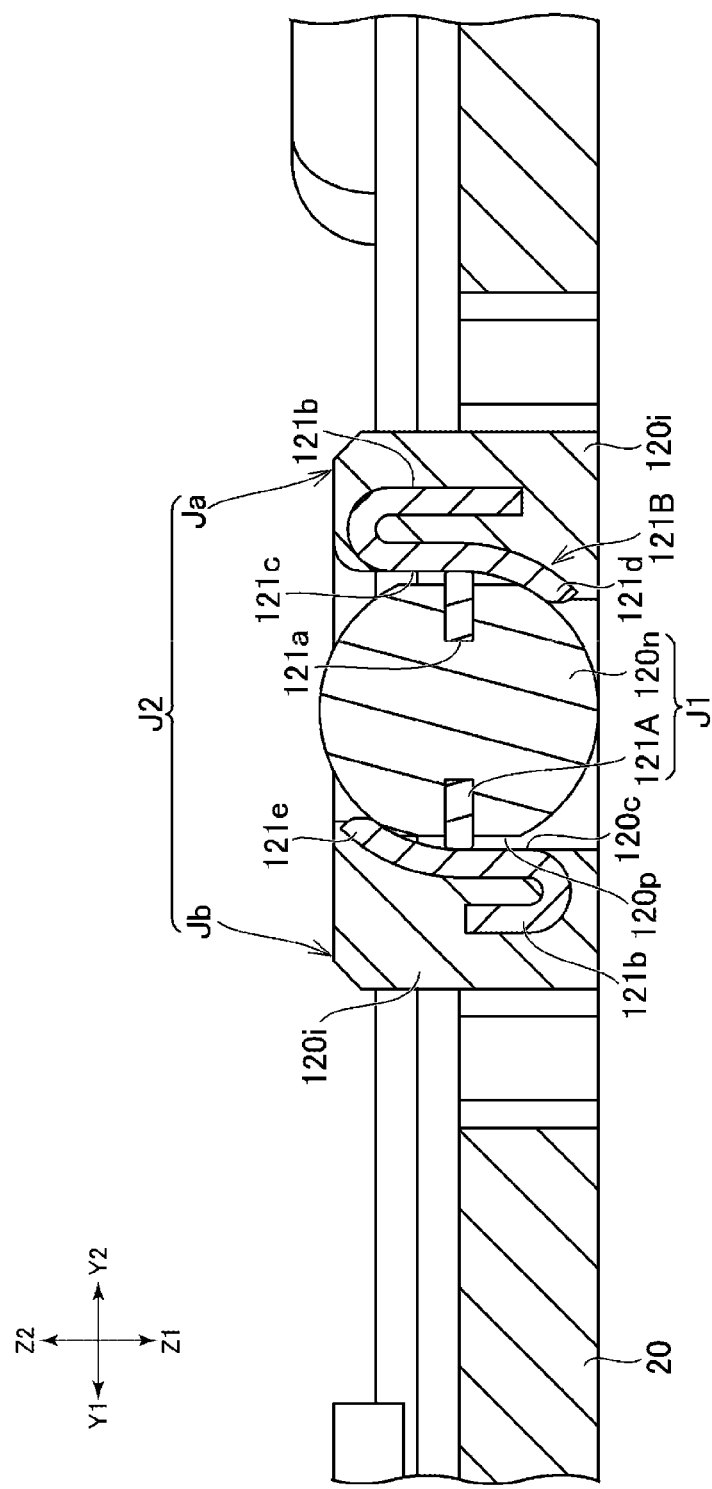
FIG. 10 is a cross sectional view along line X-X illustrated in FIG. 7.

FIGS. 7 to 10 are views illustrating modified examples of the power generation unit 2. In FIG. 7, a power generation unit 102 is illustrated as the modified example of the power generation unit 2. In FIGS. 8 to 10, the first connector part J1 and the second connector part J2 possessed by the power generation unit 102 are illustrated. Note that in the power generation unit 102, unlike the example of the power generation unit 2, the first connector part J1 and the first edge 20a with the first connector part J1 formed thereat are disposed on the left side to the center of the power generation unit 102, while the second connector part J2 and the second edge 20b with the second connector part J2 formed thereat are disposed on the right side to the center of the power generation unit 102.

The third connector part J3 and the fourth connector part J4 illustrated in FIG. 7 are respectively identical to the first connector part J1 and the second connector part J2 illustrated in the figures. When the power generation unit 102 is rotated by 90°, the first connector part J1 reaches the position of the third connector part J3. Similarly, the second connector part J2 has the same shape and structure as the fourth connector part J4; wherein, when the power generation unit 2 is rotated by 90°, the second connector part J2 reaches the position of the fourth connector part J4.

The power generation unit 102 has a base material 20. In the power generation unit 102, a conductor plate (metal plate, not illustrated) functioning as the conductor lines 23a, 23b is embedded in resin serving as the material of the base material 20. That is, the conductor plate and the base material 20 are insert molded. The diodes 22a to 22d of the rectifier circuit 22 are electrically connected to this conductor plate, for example, via a through hole formed in the base material 20.

The second connector part J2 and the first connector part J1 also configure the ball joint. The first connector part J1 functions as the ball of the ball joint, while the second connector part J2 functions as the socket of the ball joint.

As illustrated in FIG. 9, the base material 20 has a terminal support part 120n protruding from the first edge 20a to the left. The terminal support part 120n is a part integrally formed with a resin part of the base material 20. The end of the terminal support part 120n is formed in a substantially spherical shape. The portion of the conductor plate configuring the conductor line 23d reaches the terminal support part 120n. In addition, a portion of this conductor plate is exposed at the outer surface of the terminal support part 120n so as to configure a first plus terminal 121A. The first plus terminal 121A forms a circular shape in a plan view, wherein the outer peripheral edge thereof protrudes from the outer surface of a spherical part of the terminal support part 120n (see FIG. 10). As illustrated in FIG. 10, the terminal support part 120n has a flat face 120p on the side face thereof. The first plus terminal 121A protrudes from this face 120p.

As illustrated in FIG. 10, a hole 121a is formed at the central part of the first plus terminal 121A. The upper part (the part above the first plus terminal 121A) and the lower part (the part below the first plus terminal 121A) of the terminal support part 120n are connected via this hole 121a. This structure enables the first plus terminal 121A to be firmly held by resin serving as the material of the terminal support part 120n.

As illustrated in FIG. 9, the second connector part J2 has mutually facing connector half parts Ja, Jb. The connector half parts Ja, Jb have a terminal support part 120i protruding from the second edge 20b of the base material 20 to the right. The portion of the conductor plate configuring the conductor line 23d reaches the terminal support part 120i. In addition, this portion of the conductor plate is exposed on the outer surface of the terminal support part 120i towards the inside of the two connector half parts Ja, Jb so as to configure a second plus terminal 121B.

More specifically, as illustrated in FIG. 10, the second plus terminal 121B has a base part 121b held inside the terminal support part 120i, along with a contact part 121c which is folded towards the base part 121b and exposed on the outer surface of the terminal support part 120i towards the inside of the connector half parts Ja, Jb. Two contact parts 121c sandwich the first plus terminal 121A of the first connector part J1. As a result, the first plus terminal 121A of one power generation unit 102 and the second plus terminal 121B of the adjacent power generation unit 102 are electrically connected.

In the example of the power generation unit 102, the second connector part J2 has a stopper for regulating the vertical movement of the first connector part J1. Specifically, as illustrated in FIG. 10, in one connector half part Ja, the contact part 121c of the second plus terminal 121B is curved inward. That is, the contact part 121c is curved inward in the lower part 121d thereof. Also in the other connector half part Jb, the contact part 121c of the second plus terminal 121B is curved inward. That is, the contact part 121c is curved inward in the upper part 121e thereof. In addition, the vertical movement of the first connector part J1 is regulated by curved parts (the lower part 121d and the upper part 121e) of two contact parts 121c. In the example of the power generation unit 102, curved parts (the lower part 121d, an upper part 121e) of the two contact parts 121c contact the outer surface of the terminal support part 120n holding the first plus terminal 121A. Note that the structure of the stopper is not limited to the example described here. For example, the terminal support part 120i formed of resin, rather than the second plus terminal 121B, may contact the outer surface of the terminal support part 120n of the first connector part J1.

Moreover, the second connector part J2, as illustrated in FIG. 9, may have a stopper 120k for limiting the transverse movement of the first connector part J1. The stopper 120k may be a projection protruding from the tips of two terminal support parts 120i towards the inside of the two connector half parts Ja, Jb.

The structure of the power generation apparatus and power generation unit proposed in the present disclosure are not limited to the examples indicated as the abovementioned power generation apparatus 10 and power generation units 2, 102, and various changes are capable of being made.

The invention claimed is:

1. A power generation apparatus, comprising: a first power generation unit; and a second power generation unit electrically connected to the first power generation unit;
wherein each of the first power generation unit and the second power generation unit includes:
a power generation element;
a base material which holds the power generation element, and includes: a first edge in a first direction; a second edge which is the edge facing the first edge; a third edge formed in a second direction orthogonal to the first direction; and a fourth edge which is the edge facing the third edge;
a first plus terminal serving as a positive electrode which is provided at the first edge and connected to the power generation element;
a second plus terminal serving as a positive electrode which is provided at the second edge and connected to the power generation element;
a first minus terminal serving as a negative electrode which is provided at the third edge and connected to the power generation element; and
a second minus terminal serving as a negative electrode which is provided at the fourth edge and connected to the power generation element.

2. The power generation apparatus according to claim 1, wherein the first plus terminal of the first power generation unit and the second plus terminal of the second power generation unit are electrically connected, or
the first minus terminal of the first power generation unit and the second minus terminal of the second power generation unit are electrically connected.

3. The power generation apparatus according to claim 1, wherein the first power generation unit and the second power generation unit can be mechanically coupled.

4. The power generation apparatus according to claim 3, wherein the first power generation unit is tiltable to the second power generation unit while being electrically and mechanically connected to the second power generation unit.

5. The power generation apparatus according to claim 3, wherein a first connector part including the first plus terminal is provided at the first edge,
a second connector part including the second plus terminal is provided at the second edge,
a third connector part including the first minus terminal is provided at the third edge,
a fourth connector part including the second minus terminal is provided at the fourth edge, and
one connector part of the first connector part and the second connector part forms a projection, while the other connector part thereof forms a recess having a shape with the one connector part capable of being fitted therein, and/or one connector part of the third connector part and the fourth connector part forms a projection, while the other connector part thereof forms a recess having a shape with the one connector part capable of being fitted therein.

6. The power generation apparatus according to claim 5, wherein the first connector part can be removed from the second connector part towards a first side in a third direction orthogonal to both the first direction and the second direction, as well as towards a second side facing the first side in the third direction,
and/or
the third connector part can be removed from the fourth connector part towards the first side in the third direction, as well as towards the second side in the third direction.

7. The power generation apparatus according to claim 5, wherein the first connector part of the first power generation unit and the second connector part of the second power generation unit configure the ball joint,
and/or
the third connector part of the first power generation unit and the fourth connector part of the second power generation unit configure a ball joint.

8. The power generation apparatus according to claim 1, wherein each of the first power generation unit and the second power generation unit includes: four terminals consisting of the first plus terminal, the second plus terminal, the first minus terminal, and the second minus terminal; and a rectifier circuit disposed in a space with respect to the power generation element.

9. The power generation apparatus according to claim 5, wherein a connector housing recess is formed at minimally one edge of the first edge, the second edge, the third edge, and the fourth edge, and
a connector part of the at least one edge is formed at the connector housing recess of the minimally one edge.

10. The power generation apparatus according to claim 2, further comprising: a coupling part coupled to the first power generation unit and the second power generation unit,
wherein the first plus terminal of the first power generation unit and the second plus terminal of the second power generation unit are electrically connected, while the coupling part electrically connects the first minus terminal of the first power generation unit and the first minus terminal of the second power generation unit, or
wherein the first minus terminal of the first power generation unit and the second minus terminal of the second power generation unit are electrically connected, while the coupling part electrically connects the first plus terminal of the first power generation unit and the first plus terminal of the second power generation unit.

11. The power generation apparatus according to claim 10, wherein the coupling part includes: a first coupling unit coupled to the first power generation unit; and a second coupling unit which is coupled to the second power generation unit and the first coupling unit.

12. The power generation apparatus according to claim 8, wherein each of the first power generation unit and the second power generation unit includes:
a conductor line for electrically connecting the first plus terminal and the second plus terminal, and a conductor line for connecting the first plus terminal and the second plus terminal to the power generation element connected,
and/or
a conductor line for electrically connecting the first minus terminal and the second minus terminal; and a conductor line for connecting the first minus terminal and the second minus terminal to the power generation element.

* * * * *